(12) United States Patent
Jung

(10) Patent No.: US 7,314,810 B2
(45) Date of Patent: Jan. 1, 2008

(54) METHOD FOR FORMING FINE PATTERN OF SEMICONDUCTOR DEVICE

(75) Inventor: Jae Chang Jung, Seoul (KR)

(73) Assignee: Hynix Semiconductor Inc., Icheon-Si (KR)

( * ) Notice: Subject to any disclaimer, the term of this patent is extended or adjusted under 35 U.S.C. 154(b) by 0 days.

(21) Appl. No.: 11/617,672

(22) Filed: Dec. 28, 2006

(65) Prior Publication Data

US 2007/0264828 A1    Nov. 15, 2007

(30) Foreign Application Priority Data

May 9, 2006    (KR) .................... 102006-0041513
Dec. 20, 2006  (KR) .................... 10-2006-0131000

(51) Int. Cl.
H01L 21/76   (2006.01)
H01L 21/461  (2006.01)
H01L 21/302  (2006.01)

(52) U.S. Cl. .................. 438/445; 438/717; 438/725

(58) Field of Classification Search .................. None
See application file for complete search history.

(56) References Cited

U.S. PATENT DOCUMENTS

| | | | |
|---|---|---|---|
| 3,666,473 A | 5/1972 | Colom et al. | |
| 4,115,128 A | 9/1978 | Kita | |
| 4,275,139 A | 6/1981 | Stahlhofen | |
| 6,774,051 B2 * | 8/2004 | Chung et al. | 438/778 |
| 6,893,972 B2 * | 5/2005 | Rottstegge et al. | 438/706 |
| 2001/0021586 A1 * | 9/2001 | Shinomiya et al. | 438/706 |
| 2003/0157436 A1 * | 8/2003 | Manger et al. | 430/311 |
| 2006/0240639 A1 * | 10/2006 | Akiyama | 438/445 |

FOREIGN PATENT DOCUMENTS

| | | |
|---|---|---|
| JP | 61-205933 | 9/1986 |
| JP | 02-109051 | 4/1990 |
| JP | 05-088364 | 4/1993 |
| JP | 08-082926 | 3/1996 |
| JP | 09-015853 | 1/1997 |
| JP | 10-020503 | 1/1998 |
| JP | 2000-137324 | 5/2000 |

* cited by examiner

*Primary Examiner*—Duy-Vu N Deo
(74) *Attorney, Agent, or Firm*—Townsend & Townsend & Crew LLP

(57) ABSTRACT

A method for forming fine patterns of a semiconductor device includes forming hard mask patterns over an underlying layer. A first organic film is formed over the hard mask patterns. A second organic film is formed over the first organic film. The second organic film is planarized until the first organic film is exposed. An etch-back process is performed on the first organic film until the underlying layer is exposed. The first organic film and the second organic film are etched to form organic mask patterns including the first organic film and the second organic film. Each organic mask pattern is formed between adjacent hard mask patterns. The underlying layer is etched using the hard mask patterns and the organic mask patterns as an etching mask to form an underlying layer pattern.

20 Claims, 4 Drawing Sheets

METHOD FOR FORMING FINE PATTERN OF SEMICONDUCTOR DEVICE

CROSS-REFERENCES TO RELATED APPLICATIONS

The present application claims priority to Korean patent application number 10-2006-0041513, filed on May 9, 2006, which is incorporated herein by reference in its entirety.

BACKGROUND OF THE INVENTION

The present invention generally relates to a method for forming a fine pattern of a semiconductor device.

As the demand for smaller size semiconductor devices increases, patterns are formed closer together on a semiconductor substrate. Resist and exposers have been developed for obtaining fine patterns on a semiconductor substrate.

In photo-lithography, an exposure process utilizes KrF (248 nm) or ArF (193 nm) as a light source. A conventional exposure process utilizes a short wavelength light source such as $F_2$ (157 nm) or EUV (13 nm). However, when a new light source is applied, another exposure process is required. As a result, manufacturing costs increase and a focus depth width is degraded. In addition, since the resolution of exposing with the short wavelength light source is limited to 0.1 μm, it is difficult to form the fine patterns required for highly integrated semiconductor devices.

BRIEF SUMMARY OF THE INVENTION

A method for forming a fine pattern of a semiconductor device comprises a double etching process. Specifically, a method for forming a fine pattern of a semiconductor device comprises forming a hard mask pattern over an underlying layer formed over a substrate. A first organic film is formed over the hard mask pattern. The first organic film conforms to the shape of the hard mask pattern and the underlying layer. A second organic film is formed over the first organic film. The second organic film is planarized until the first organic film is exposed through the surface of the second organic film. The first organic film is etched until the underlying layer is exposed. Another etching process is performed on the first organic film and the second organic film to form organic mask patterns. Each organic mask pattern has a stack structure that includes the first organic film and the second organic film. The organic mask patterns are formed between adjacent hard mask patterns. The underlying layer is etched using the hard mask pattern and the organic mask pattern as an etching mask to form an underlying layer pattern.

DESCRIPTION OF SPECIFIC EMBODIMENTS

A method for forming a fine pattern of a semiconductor device uses a double etching process. The method is useful to secure overlapping and arranging margins. As a result, the disclosed method reduces manufacturing costs and decreases processing time. The method for forming a fine pattern of a semiconductor device will be described in detail with reference to the accompanying drawings, which are not intended to limit the claimed invention.

FIGS. 1a through 1h are cross-sectional diagrams illustrating a method for forming a fine pattern of a semiconductor device according to an embodiment of the present invention.

Figure 1A:
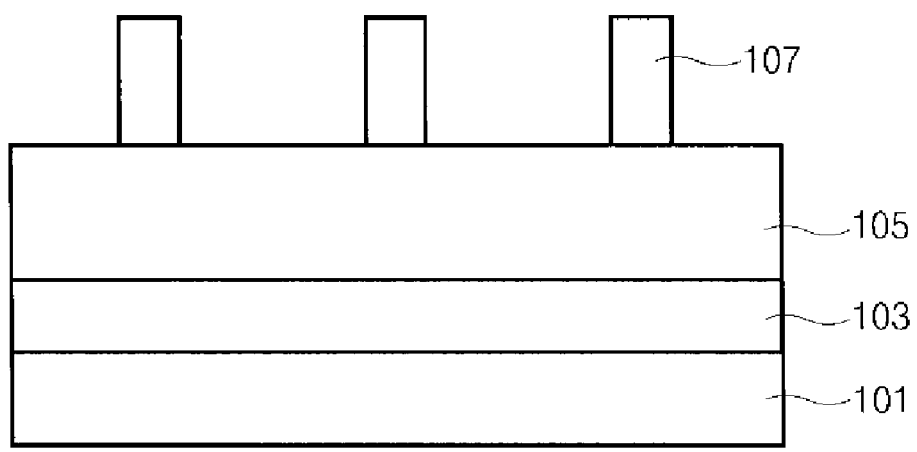
FIGS. 1a through 1h are cross-sectional diagrams illustrating a method for forming a fine pattern of a semiconductor device according to an embodiment of the present invention.

FIG. 1a shows a first underlying layer 103 and a second underlying layer 105 sequentially formed over a semiconductor substrate 101. The first and second underlying layers 103, 105 are formed by a material suitable for use as a word line, a bit line or a metal line. Hard mask patterns 107 are formed over the second underlying layer 105 at the smallest spacing interval that can be obtained by a lithography process.

Each hard mask pattern is formed by forming a hard mask film over the second underlying layer 105. A photoresist film is coated over the resulting structure. An exposure process is performed with an exposure mask positioned over the photoresist film. A developing process is performed to form a photoresist pattern. The hard mask film is etched using the photoresist pattern as an etching mask. The photoresist pattern is then removed. In one embodiment, the hard mask pattern is formed of: polysilicon, an oxide film, a nitride film, metal or combinations thereof.

Figure 1B:
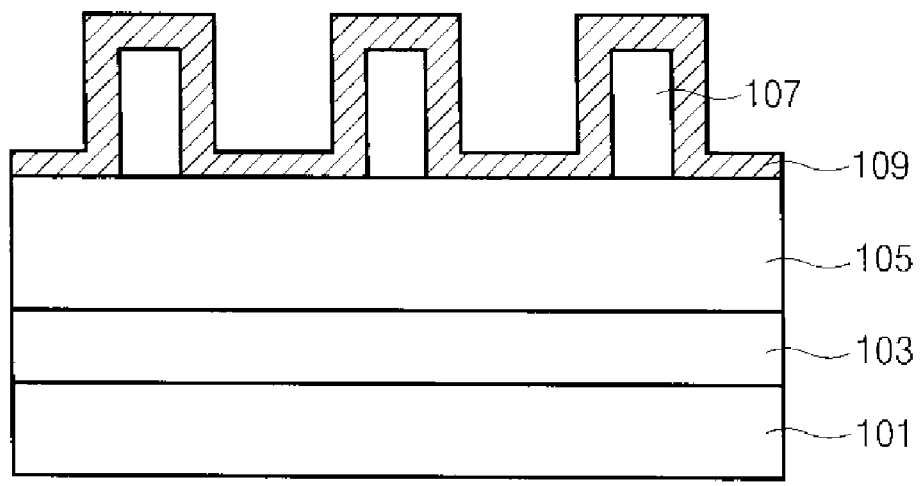

FIG. 1b shows that a first organic film 109 is formed over the hard mask patterns 107 such that the first organic film 109 conforms to the shape of the hard mask patterns 107 and the second underlying layer 105. The first organic film 109 may be any organic film formed by a spin-coating process or a deposition process. For example, the first organic film 109 may include organic polymers such as a photoresist film or an anti-reflection film. Specifically, the first organic film 109 comprises a polymer that includes a aliphatic polyester compound, a polyamic acid compound or a combination thereof as the main component.

The aliphatic polyester compound may include polyethylene adipate, polybutylene adipate, polyisopropylene adipate or combinations thereof. The polyamic acid compound may include a polyamic acid compound of hexamethylene diamine and pyromellitic dianhydride, a polyamic acid compound of propane diamine and pyromellitic dianhydride, a polyamic acid compound of N,N'-dimethyl-1,3-propane diamine and pyromellitic dianhydride, or combinations thereof.

Figure 1C:
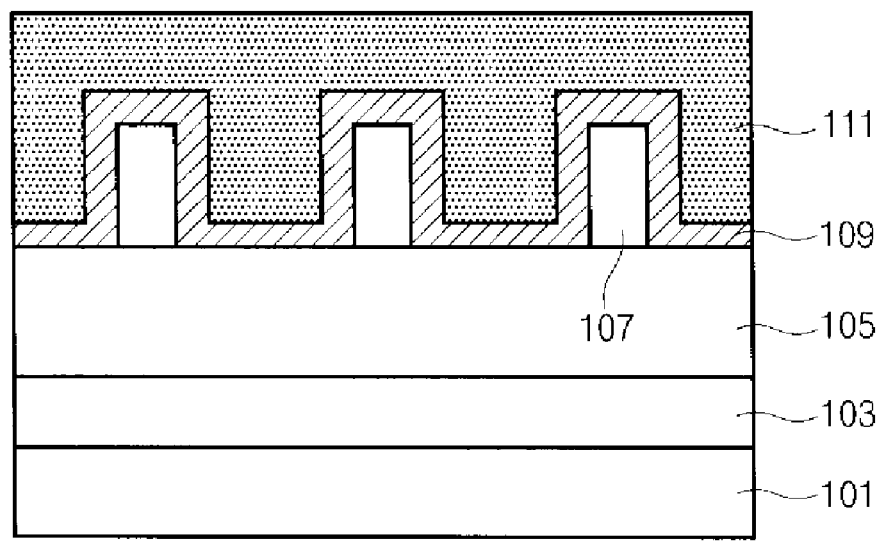

FIG. 1c illustrates a second organic film 111 formed over the first organic film 109. The second organic film 111 is formed with a material having an etching selectivity that is different than the etching selectivity of the first organic film 109 and the hard mask patterns 107.

The second organic film 111 may include a photoresist for I-line, a novolak compound or a quinine diazide/ester compound, which may be formed by a spin-coating process. For example, the photoresist for I-line is disclosed in U.S. Pat. No. 3,666,473, U.S. Pat. No. 4,115,128, Japan Publication No. S55-73045, Japan Publication No. S61-205933, Japan Publication No. H2-109051, Japan Publication No. H5-88364, Japan Publication No. H8-82926, Japan Publication No. H9-15853, Japan Publication No. H10-20503 and Japan Publication No. 2000-137324.

Figure 1D:
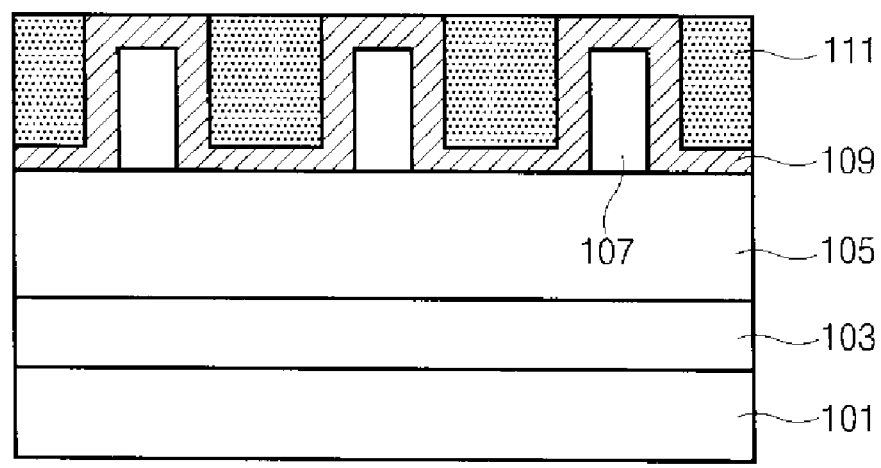

FIG. 1d shows that a planarizing process is performed on the second organic film 111 until the first organic film 109 is exposed. The second organic film 111 remains between adjacent portions of the exposed first organic film 109. The planarizing process may be performed by a chemical-mechanical planarization process or by an etch-back process using an etching gas of: nitrogen, oxygen, argon, hydrogen, chlorine or combinations thereof.

Figure 1E:
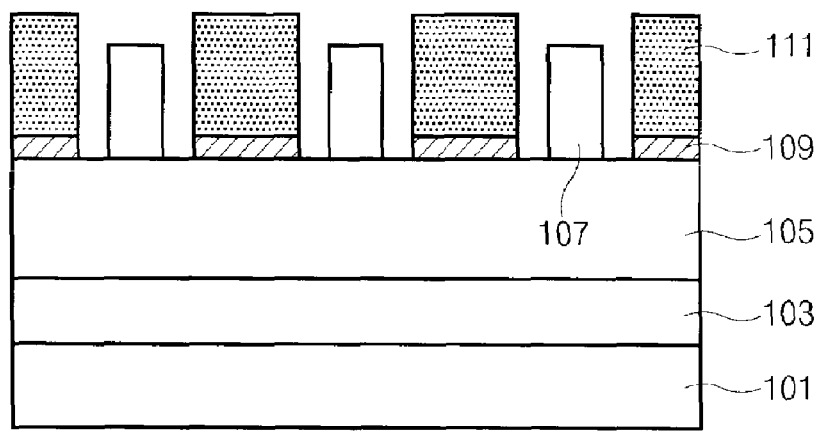
Figure 1F:
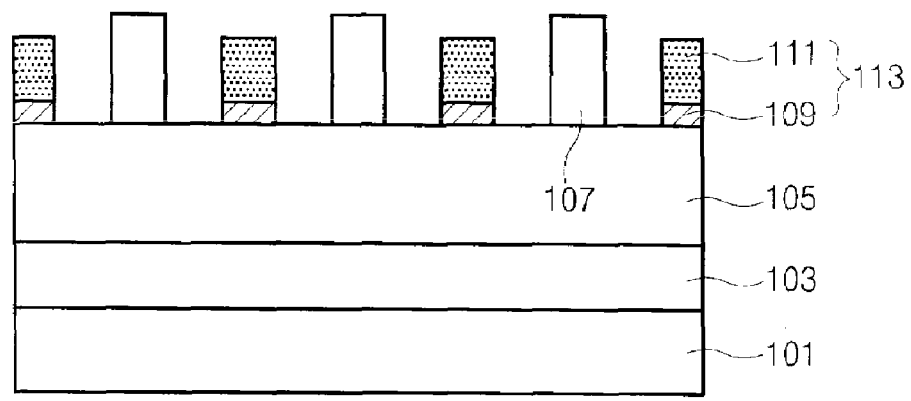

FIGS. 1e and 1f show that organic mask patterns 113 are formed between adjacent hard mask patterns 107 by a double etching process. FIG. 1e shows that an etch-back process is performed on the first organic film 109 that is exposed by the process of FIG. 1d to remove the first organic film 109 between adjacent hard mask patterns 107.

The etch-back process is performed so that the first organic film 109 is etched faster than the second organic film 111 or the hard mask patterns 107 until the top surface of the underlying layer 105 is exposed. In one embodiment, the etching speed of the first organic film 109 is approximately two to three times faster than the etching speed of the second organic film 111 or the hard mask pattern 107.

The etch-back process is performed with an etching gas which includes an oxygen content of approximately 5-10 vol % and at least one of: nitrogen, fluorine, and argon. In one embodiment, the etching gas includes $O_2$ of 7 sccm, $CF_4$ of 30 sccm and Ar of 130 sccm. As a result, the first organic film 109 may be removed from the underlying layer 105 before the second organic film 111 or the hard mask pattern 107 is damaged. If the oxygen content is less than approximately 5 vol % or more than approximately 10 vol %, it may be difficult to etch the first organic film 109 without damaging of the second organic film 111 or the hard mask pattern 107.

FIG. 1f shows organic mask patterns 113 formed on the underlying layer 105 by an isotropic etching process. Each organic mask pattern 113 is formed between adjacent hard mask patterns 107. Each organic mask pattern 113 has a stack structure that includes the first organic film 109 and the second organic film 111.

The isotropic etching process is performed so that the second organic film 111 is etched faster than the hard mask patterns 107, and the first organic film 109 is etched faster than the second organic film 111. In one embodiment, the etching speed of the second organic film is approximately nine to ten times faster than the etching speed of the hard mask patterns. In another embodiment, the etching speed of the first organic film is approximately two to three times faster than the etching speed of the second organic film. As a result, the organic mask patterns 113 are formed between adjacent hard mask patterns 107 without any etching masks. In one embodiment, the organic mask patterns 113 have substantially the same width as that of the hard mask patterns 107.

The isotropic etching process is performed with an etching gas which includes an oxygen content of approximately 1-2 vol % and at least one of: nitrogen, argon, and hydrogen. In one embodiment, the etching gas includes $O_2$ of 3 sccm, $CF_4$ of 90 sccm and Ar of 40 sccm. It is preferable to adjust voltages of a source power of an etching gas pressure and a bias power that is effective in direction control of the etching gas so that the organic mask patterns 113 are formed to have substantially the same line-width as that of the hard mask patterns 107. If the oxygen content is less than approximately 1 vol % or more than approximately 2 vol %, it is difficult to etch the organic mask patterns 113 without damaging the hard mask patterns 107.

Figure 1G:
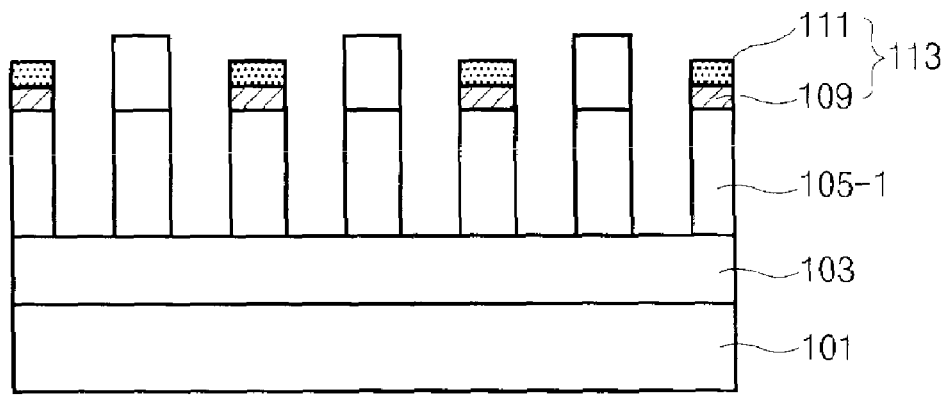
Figure 1H:
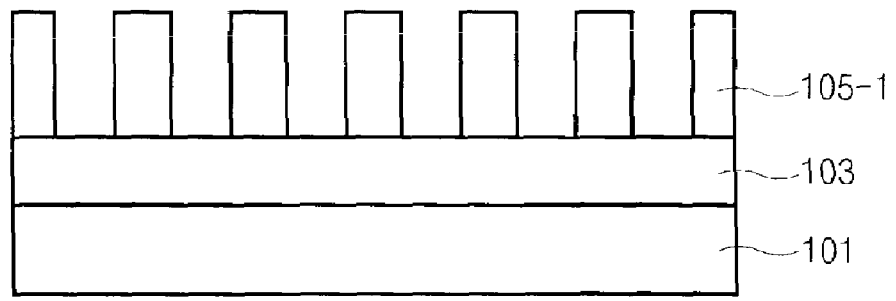

FIG. 1g shows that a second underlying pattern 105-1 is formed by etching the second underlying layer 105. In this etching process, the hard mask patterns 107 and the organic mask patterns 113 are used as an etching mask. FIG. 1h shows the second underlying pattern 105-1 after a washing process is performed.

The double etching process is performed to obtain organic mask patterns at a smaller pitch than can be obtained by a conventional lithography device. When the underlying layer is etched with organic mask patterns formed between adjacent hard mask patterns, a fine pattern is achieved that cannot be obtained by a conventional lithography device.

The above embodiments of the present invention are illustrative and not limitative. Various alternatives and equivalents are possible. The invention is not limited by the lithography steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A method for forming patterns of a semiconductor device, the method comprising:
   forming hard mask patterns over an underlying layer formed over a substrate;
   forming a first organic film over the hard mask patterns, wherein the first organic pattern conforms to the shape of the underlying layer and the hard mask patterns;
   forming a second organic film over the first organic film;
   planarizing the second organic film until the first organic film is exposed;
   etching the first organic film until the underlying layer is exposed;
   etching the first organic film and the second organic film to form organic mask patterns, each organic mask pattern having a stack structure comprising the first organic film and the second organic film, wherein each organic mask pattern is formed between adjacent hard mask patterns; and
   etching the underlying layer using the hard mask patterns and the organic mask patterns as an etching mask to form an underlying layer pattern.

2. The method according to claim 1, wherein the underlying layer is formed of a material for a word line, a bit line or a metal line.

3. The method according to claim 1, wherein each hard mask pattern is formed of one of: polysilicon, an oxide film, a nitride film, metal or combinations thereof.

4. The method according to claim 1, wherein method for forming the hard mask patterns comprises:
   forming a hard mask film over the underlying layer;
   coating a photoresist film over the hard mask film;
   exposing and developing the photoresist film to form a photoresist pattern;
   patterning the hard mask film using the photoresist pattern as an etching mask; and
   removing the photoresist pattern.

5. The method according to claim 1, wherein the first organic film comprises an organic polymer film formed by one of: a spin-coating process or a deposition process.

6. The method according to claim 5, wherein the first organic film comprises a polymer which includes as a main component one of: an aliphatic polyester compound or a polyamic acid compound.

7. The method according to claim 6, wherein the aliphatic polyester compound is selected from the group consisting of: polyethylene adipate, polybutylene adipate, polyisopropylene adipate and combinations thereof.

8. The method according to claim 6, wherein the polyamic acid compound is selected from the group consisting of: a polyamic acid compound of hexamethylene diamine and pyromellitic dianhydride, a polyamic acid compound of propane diamine and pyromellitic dianhydride, a polyamic acid compound of N,N'-dimethyl-1,3-propane diamine and pyromellitic dianhydride, and combinations thereof.

9. The method according to claim 1, wherein the second organic film has a different etching selectivity than that of the first organic film and the hard mask patterns.

10. The method according to claim 1, wherein the second organic film comprises a photoresist for I-line.

11. The method according to claim 10, wherein the photoresist for I-line is selected from the group consisting of: novolak compound, quinone diazide/ester compound, and combinations thereof.

12. The method according to claim 1, wherein etching the first organic film until the underlying layer is exposed further comprises etching the first organic film faster by 2~3 times than the second organic film and the hard mask patterns.

13. The method according to claim 12, wherein etching the first organic film until the underlying layer is exposed further comprises etching the first organic film using an etching gas which includes an oxygen content of approximately 5-10% and at least one of: nitrogen, argon, chlorine, and hydrogen.

14. The method according to claim 1, wherein etching the first organic film to form organic mask patterns further comprises etching the second organic film faster by 9~10 times than the hard mask patterns and etching the first organic film faster by 2~3 times than the second organic film.

15. The method according to claim 14, wherein etching the first organic film to form the organic mask patterns further comprises etching the first organic film using an etching gas which includes an oxygen content of approximately 1-2% and at least one of: nitrogen, argon, chlorine, and hydrogen.

16. The method according to claim 15, wherein etching the first organic film to form the organic mask patterns further comprises etching the first organic film to form the organic mask patterns having substantially the same width as that of the hard mask patterns by controlling a source power and a bias power.

17. A method for forming a pattern of a semiconductor device, the method comprising:
    forming a hard mask pattern over an underlying layer formed over a substrate;
    forming a first organic film over the hard mask pattern;
    forming a second organic film over the first organic film;
    planarizing the second organic film until the first organic film is exposed;
    etching the first organic film until the underlying layer is exposed;
    etching the first organic film and the second organic film to form an organic mask pattern having a stack structure comprising the first organic film and the second organic film; and
    etching the underlying layer using the hard mask pattern and the organic mask pattern as an etching mask to form an underlying layer pattern.

18. The method according to claim 17, wherein the second organic film has a higher etching selectivity than that of the first organic film and the hard mask pattern.

19. The method according to claim 17, etching the first organic film until the underlying layer is exposed further comprises etching the first organic film faster by 2~3 times than the second organic film and the hard mask pattern.

20. The method according to claim 17, wherein etching the first organic film to form the organic mask pattern further comprises etching the second organic film faster by 9~10 times than the hard mask pattern and etching the first organic film faster by 2~3 times than the second organic film.

* * * * *